(12) United States Patent
Tsuchiya

(10) Patent No.: US 6,359,740 B1
(45) Date of Patent: Mar. 19, 2002

(54) IMAGE CAPTURING DEVICE

(75) Inventor: Takashi Tsuchiya, Kaohsiung Hsien (TW)

(73) Assignee: San Hua Tien Precision Circuit Co., Ltd., Kaoshiung Hsien (TW)

( * ) Notice: Subject to any disclaimer, the term of this patent is extended or adjusted under 35 U.S.C. 154(b) by 0 days.

(21) Appl. No.: 09/665,287

(22) Filed: Sep. 20, 2000

(51) Int. Cl.[7] .................................................. G02B 7/02
(52) U.S. Cl. ........................ 359/819; 359/813; 359/825; 359/827
(58) Field of Search ............................... 359/813, 815, 359/819, 822, 823, 825, 827, 829, 830

(56) References Cited

U.S. PATENT DOCUMENTS 4,281,895 A * 8/1981 Mohr .......................... 359/827
5,327,188 A * 7/1994 Kohmoto ..................... 354/295
6,215,604 B1 * 4/2001 Hori ............................ 359/819

\* cited by examiner

Primary Examiner—Loha Ben
Assistant Examiner—Saeed Seyrafi
(74) Attorney, Agent, or Firm—Rabin & Berdo, P.C.

(57) ABSTRACT

An image capturing device has a base plate with a solid-state optical sensor mounted on the top surface. The base plate has a plurality of apertures defined therethrough. A glass frame is detachably mounted on the base plate and has an opening defined therethrough and a piece of glass mounted at the upper end of the opening. A lens retainer is detachably mounted on the glass frame and has a tubular portion with a hole in alignment with the optical sensor, a male thread formed at an outer periphery of the tubular portion; and an adjusting ring covering the tubular portion and having a female thread engaged with the male thread on the tubular portion and a lens installed therein.

20 Claims, 3 Drawing Sheets

IMAGE CAPTURING DEVICE

BACKGROUND OF THE INVENTION

1. Field of the Invention

The present invention is related to an image capturing device, and more particularly to an image capturing device which is easy to be assembled or disassembled.

2. Description of Related Art

Image capturing devices with solid-state optical sensors are widely used in various types of video equipment, such as video telephones, monitoring devices, cameras. The image capturing device is composed of optical elements and mechanical elements, wherein the optical elements include the solid-state optical sensor, a lens, and a glass, and the mechanical elements include means for mounting and assembling these optical elements. According to whether the distance between the lens and the solid-state optical sensor needs to be adjusted, the image capturing devices are divided into a focusing type and a non-focusing type. In both the focusing type and the non-focusing type, once the assembling of the image capturing device is accomplished, it is not easy to disassemble the mechanical elements for servicing.

Therefore, it is an objective of the invention to provide an improved image capturing device to mitigate and/or obviate the aforementioned problems.

SUMMARY OF THE INVENTION

The main objective of the present invention is to provide an image capturing device that is easy to be assembled and disassembled for service.

Another objective of the present invention is to provide an image capturing device wherein the focus can be maintained during the assembling and disassembling.

Other objects, advantages and novel features of the invention will become more apparent from the following detailed description when taken in conjunction with the accompanying drawings.

DETAILED DESCRIPTION OF PREFERRED EMBODIMENT

Figure 1:
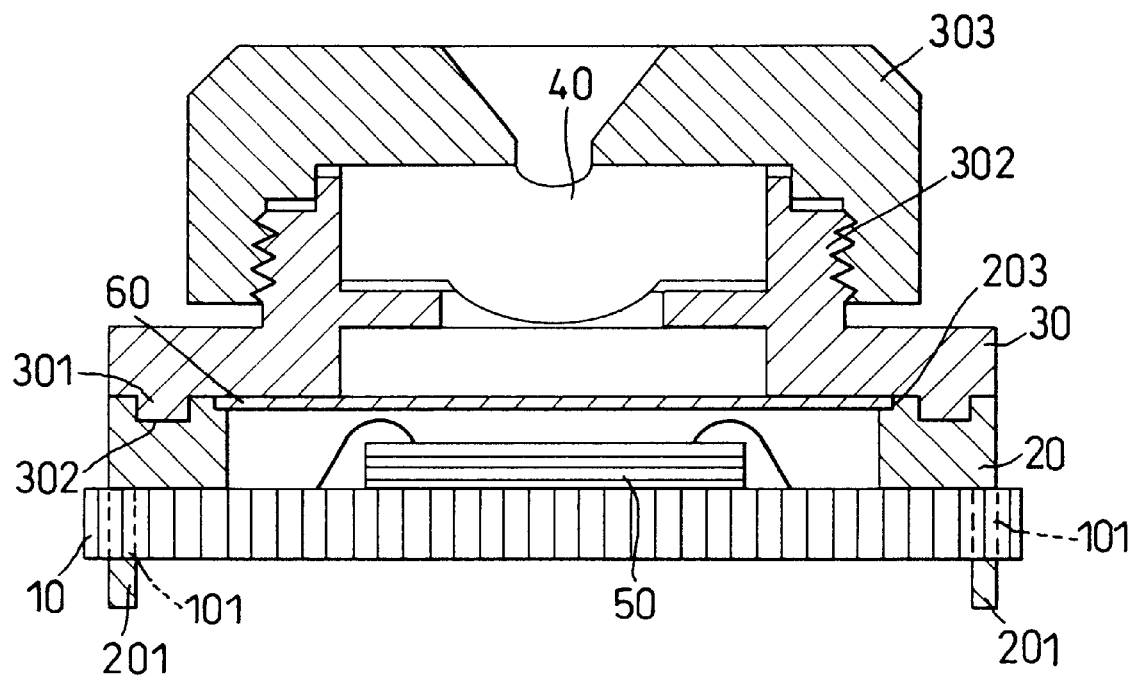
FIG. 1 is a sectional view of a first embodiment of an image capturing device in accordance with the present invention.

With reference to FIG. 1, an image capturing device in accordance with the present invention comprises a base plate (10), a glass frame (20), and a lens retainer (30).

The base plate (10) has a solid-state optical sensor (50) mounted on a top surface thereof and a plurality of apertures (101) defined therethrough.

Figure 2:
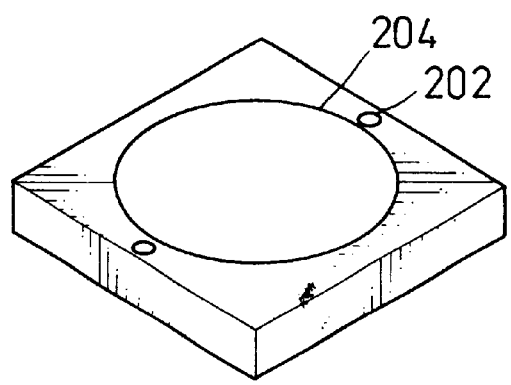
FIG. 2 is a perspective view of a glass frame in the image capturing device in accordance with the present invention.

With reference to FIG. 2, the glass frame (20) has an opening (204) defined through the center thereof. Although the opening (204) illustrated is circular, according to the present invention, a rectangular opening or a polygonal opening is also acceptable. A plurality of recesses (202) is defined in a top surface of the glass frame (20) and a plurality of pins (201) is formed at a bottom surface of the glass frame (20) and respectively extended through the apertures (101) in the base plate (10) to mount the glass frame (20) on the base plate (10). A step (203) is formed at an upper end of the opening (204) and a piece of glass (60) rests on the step (203).

Figure 3:
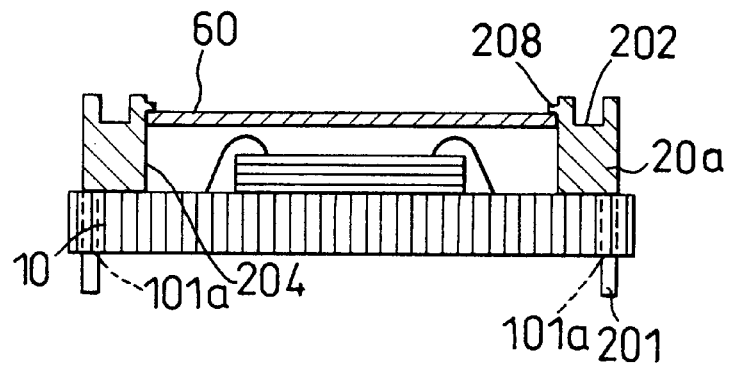
FIG. 3 is a partially sectional view of a second embodiment in accordance with the present invention.

In a second embodiment shown in FIG. 3, the glass frame (20a) has a flange (208) formed in the opening (204) and the glass (60) can be fixed upon or beneath the flange (208).

Referring back to FIGS. 1 and 2, the lens retainer (30) has a plurality of protrusions (301) formed on a bottom surface thereof and respectively engaged in the recesses (202) on the glass frame (20), and has a tubular portion (302) which is aligned with the optical sensor (50) for receiving light. A male thread is formed at an outer periphery of the tubular portion (302). An adjusting ring (303) has a female thread engaged with the male thread on the lens retainer (30) and has a lens assembly (40) installed therein. Thus, by turning the ring (303) to adjust the distance between the lens assembly (40) and the optical sensor (50), a user can adjust the focus of the image capturing device.

Figure 4:
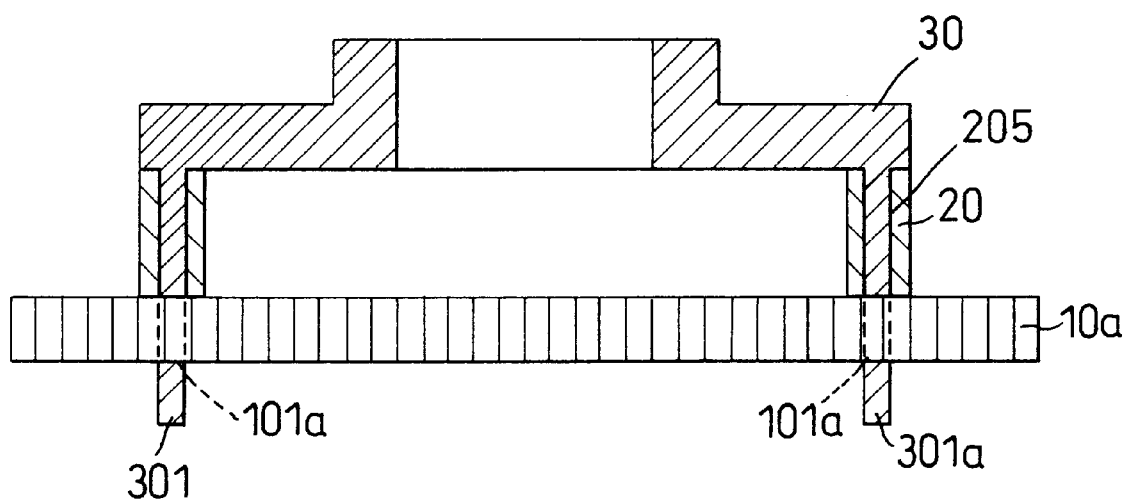
FIG. 4 is a partially sectional view of a third embodiment in accordance with the present invention.

With reference to FIG. 4, in a third embodiment of the present invention, the base plate (10a) has a plurality of apertures (101a). A plurality of passages (205) to correspond with the apertures (101a) is defined through the glass frame (20). The lens retainer (30) has a plurality of fingers (301a) formed on the bottom surface and extending through the apertures (101a) and the passages (205) to combine the glass frame (20) and the lens retainer (30) on the base plate (10a).

Figure 5:
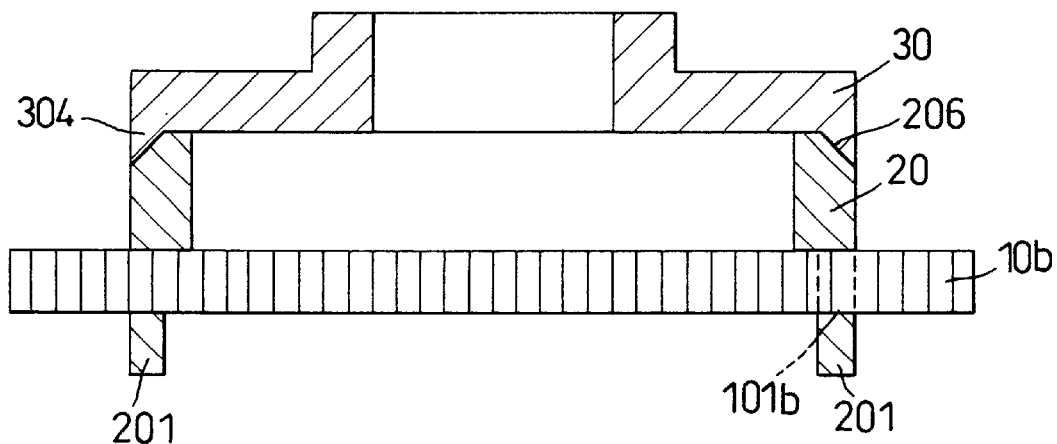
FIG. 5 is a partially sectional view of a fourth embodiment in accordance with the present invention.

In a fourth embodiment shown in FIG. 5, the base plate (10b) has a plurality of apertures (101b), and the glass frame (20) has a plurality of pins (201b) formed at the bottom surface and respectively extending through the apertures (101b). A plurality of triangular notches (206) is defined at the outside of the top surface of the glass frame (20). The lens retainer (30) has a plurality of triangular protrusions (304) formed at the bottom face and respectively received in the notches (206).

Figure 6:
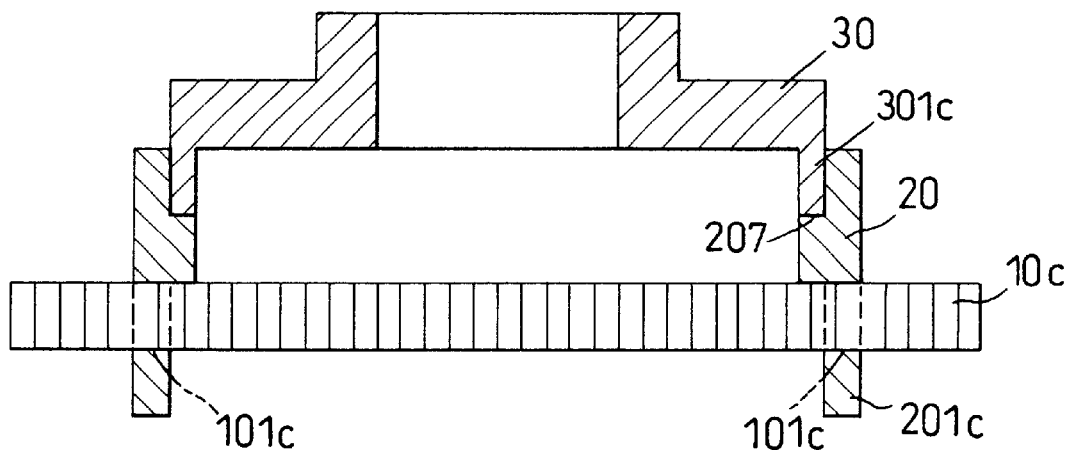
FIG. 6 is a partially sectional view of a fifth embodiment in accordance with the present invention.

In a fifth embodiment shown in FIG. 6, the base plate (10c) has a plurality of apertures (101c) and the glass frame (20) has a plurality of pins (201c) formed at the bottom face and respectively extended through the apertures (101c). A plurality of cuts (207) is defined at the inside of the upper end of the glass frame (20). The lens retainer (30) has a plurality of protrusions (301c) formed at the bottom face and respectively received in the cuts (207).

From the above description, it is noted that the invention has the following advantages:

1. Because the glass frame (20) is detachably mounted on the base plate (10) and the lens retainer (30) is detachably mounted on the glass frame (20), it is very convenient to disassemble the image capturing device for servicing.

2. Because the adjusting ring (303) is engaged with the lens retainer (30), the focus can be maintained even when the image capturing device is disassembled.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An image capturing device comprising:
   a base plate (10) with a solid-state optical sensor (50) mounted on a top surface thereof, the base plate (10) having a plurality of apertures (101) defined therethrough;
   a glass frame (20) detachably mounted on the base plate (10) and having an opening (204) defined therethrough and a piece of glass (60) mounted at an upper end of the opening (204); and
   a lens retainer (30) detachably mounted on the glass frame (20) and having a tubular portion (302) with a hole in alignment with the optical sensor (50), a male thread formed at an outer periphery of the tubular portion (302); and an adjusting ring (303) covering the tubular portion (302) and having a female thread engaged with the male thread on the tubular portion (302) and a lens (40) installed therein.

2. The image capturing device as claimed in claim 1, wherein the glass frame (20) has a plurality of pins (201) formed on a bottom face thereof and respectively extending through the apertures (101) of the base plate (10) and has a plurality of recesses (202) defined in a top face thereof, and the lens retainer (30) has a plurality of protrusions (301) formed on a bottom face thereof and respectively received in the recesses (202) of the glass frame (20).

3. The image capturing device as claimed in claim 1, wherein the glass frame (20) has a plurality of passages (205) defined therethrough, and the lens retainer (30) has a plurality of fingers (301a) formed on a bottom face thereof and respectively extending through the passages (205) and the apertures (101).

4. The image capturing device as claimed in claim 1, wherein the glass frame (20) has a plurality of pins (201) formed on a bottom face thereof and extending through the apertures (101) of the base plate (10) and has a plurality of triangular notches (206) defined in an upper end thereof, and the lens retainer (30) has a plurality of triangular protrusions (304) formed on a bottom face and respectively received in the triangular notches (206) of the glass frame (20).

5. The image capturing device as claimed in claim 1, wherein the glass frame (20) has a plurality of pins (201) formed on a bottom face thereof and extending through the apertures (101) of the base plate (10) and has a plurality of cuts (207) defined in an inner wall of an upper end thereof, and the lens retainer (30) has a plurality of protrusions (301) formed on a bottom face thereof and respectively received in the cuts (207) of the glass frame (20).

6. The image capturing device as claimed in claim 1, wherein the glass frame (20) has a step (203) formed at the upper end of the opening (204) and the glass (60) abuts the step (203).

7. The image capturing device as claimed in claim 2, wherein the glass frame (20) has a step (203) formed at the upper end of the opening (204) and the glass (60) abuts the step (203).

8. The image capturing device as claimed in claim 3, wherein the glass frame (20) has a step (203) formed at the upper end of the opening (204) and the glass (60) abuts the step (203).

9. The image capturing device as claimed in claim 4, wherein the glass frame (20) has a step (203) formed at the upper end of the opening (204) and the glass (60) abuts the step (203).

10. The image capturing device as claimed in claim 5, wherein the glass frame (20) has a step (203) formed at the upper end of the opening (204) and the glass (60) abuts the step (203).

11. The image capturing device as claimed in claim 1, wherein the glass frame (20) has a flange (208) formed at the upper end of the opening (204) and the glass (60) is fixed on a top face of the flange (208).

12. The image capturing device as claimed in claim 2, wherein the glass frame (20) has a flange (208) formed at the upper end of the opening (204) and the glass (60) is fixed on a top face of the flange (208).

13. The image capturing device as claimed in claim 3, wherein the glass frame (20) has a flange (208) formed at the upper end of the opening (204) and the glass (60) is fixed on a top face of the flange (208).

14. The image capturing device as claimed in claim 4, wherein the glass frame (20) has a flange (208) formed at the upper end of the opening (204) and the glass (60) is fixed on a top face of the flange (208).

15. The image capturing device as claimed in claim 5, wherein the glass frame (20) has a flange (208) formed at the upper end of the opening (204) and the glass (60) is fixed on a top face of the flange (208).

16. The image capturing device as claimed in claim 1, wherein the glass frame (20) has a flange (208) formed at the upper end of the opening (204) and the glass (60) is fixed on a bottom face of the flange (208).

17. The image capturing device as claimed in claim 2, wherein the glass frame (20) has a flange (208) formed at the upper end of the opening (204) and the glass (60) is fixed on a bottom face of the flange (208).

18. The image capturing device as claimed in claim 3, wherein the glass frame (20) has a flange (208) formed at the upper end of the opening (204) and the glass (60) is fixed on a bottom face of the flange (208).

19. The image capturing device as claimed in claim 4, wherein the glass frame (20) has a flange (208) formed at the upper end of the opening (204) and the glass (60) is fixed on a bottom face of the flange (208).

20. The image capturing device as claimed in claim 5, wherein the glass frame (20) has a flange (208) formed at the upper end of the opening (204) and the glass (60) is fixed on a bottom face of the flange (208).

* * * * *